(12) United States Patent
Yeung

(10) Patent No.: US 6,735,270 B1
(45) Date of Patent: May 11, 2004

(54) ASYNCHRONOUS UP-DOWN COUNTER AND METHOD FOR OPERATING THE SAME

(75) Inventor: Kwok Wah Yeung, Milpitas, CA (US)

(73) Assignee: LSI Logic Corporation, Milpitas, CA (US)

(*) Notice: Subject to any disclaimer, the term of this patent is extended or adjusted under 35 U.S.C. 154(b) by 0 days.

(21) Appl. No.: 10/295,592

(22) Filed: Nov. 14, 2002

(51) Int. Cl.[7] .............................................. H03K 23/00
(52) U.S. Cl. ..................... 377/34; 377/45; 377/104; 377/107; 377/126
(58) Field of Search ................................. 377/126, 107, 377/104, 45, 34

(56) References Cited

U.S. PATENT DOCUMENTS 4,780,894 A * 10/1988 Watkins et al. ............... 377/34

* cited by examiner

Primary Examiner—Margaret R. Wambach
(74) Attorney, Agent, or Firm—Thelen Reid & Priest LLP

(57) ABSTRACT

An asynchronous up-down counter includes a plurality of counter blocks. Each of the counter blocks has a counter output, an up-down control output, and an up-down control input. A counter signal output from each of the counter blocks has at least two bits. The asynchronous up-down counter also includes a signal bus coupling the up-down control output of a first counter block counting lesser significant bits to the up-down control input of a second counter block counting more significant bits. An up-down control signal output from each of the counter blocks has at least two bits. The up-down control signal may include a first control signal enabling counting operation of the second counter block and a second control signal indicating counting-up and counting-down.

43 Claims, 7 Drawing Sheets

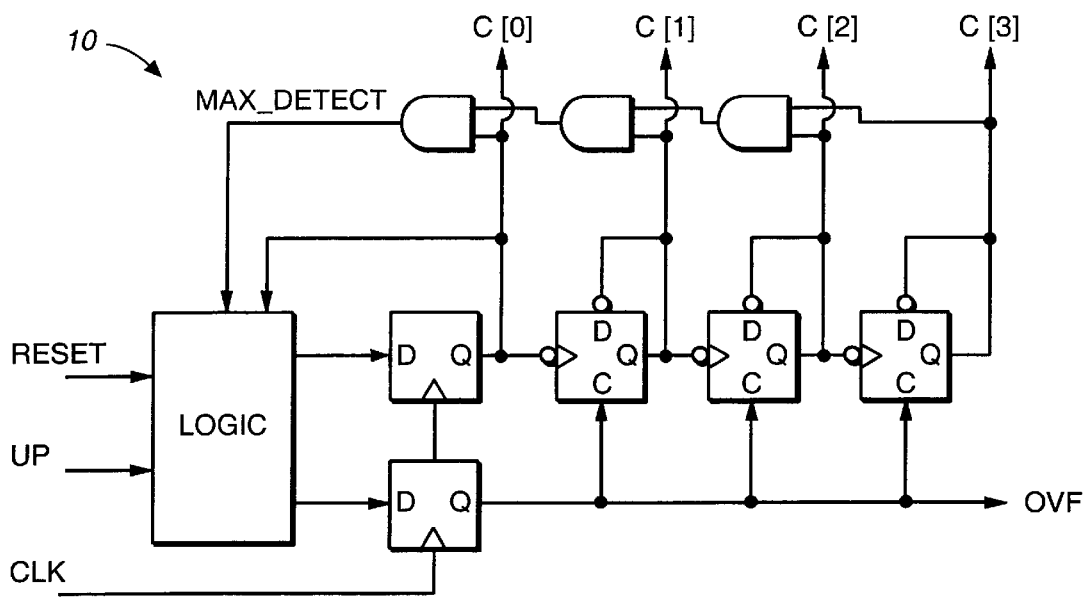
FIG._1 (PRIOR ART)
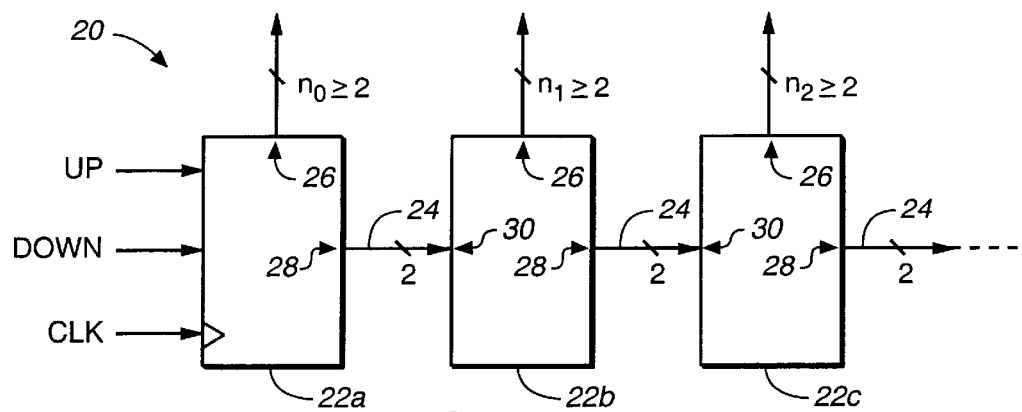
FIG._2
| | CE | Count | Binary |
|---|---|---|---|
| GREY CODE | 01 | 0 | 00 |
| | 00 | 1 | 01 |
| | 10 | 2 | 10 |
| | 11 | 3 | 11 |
FIG._3

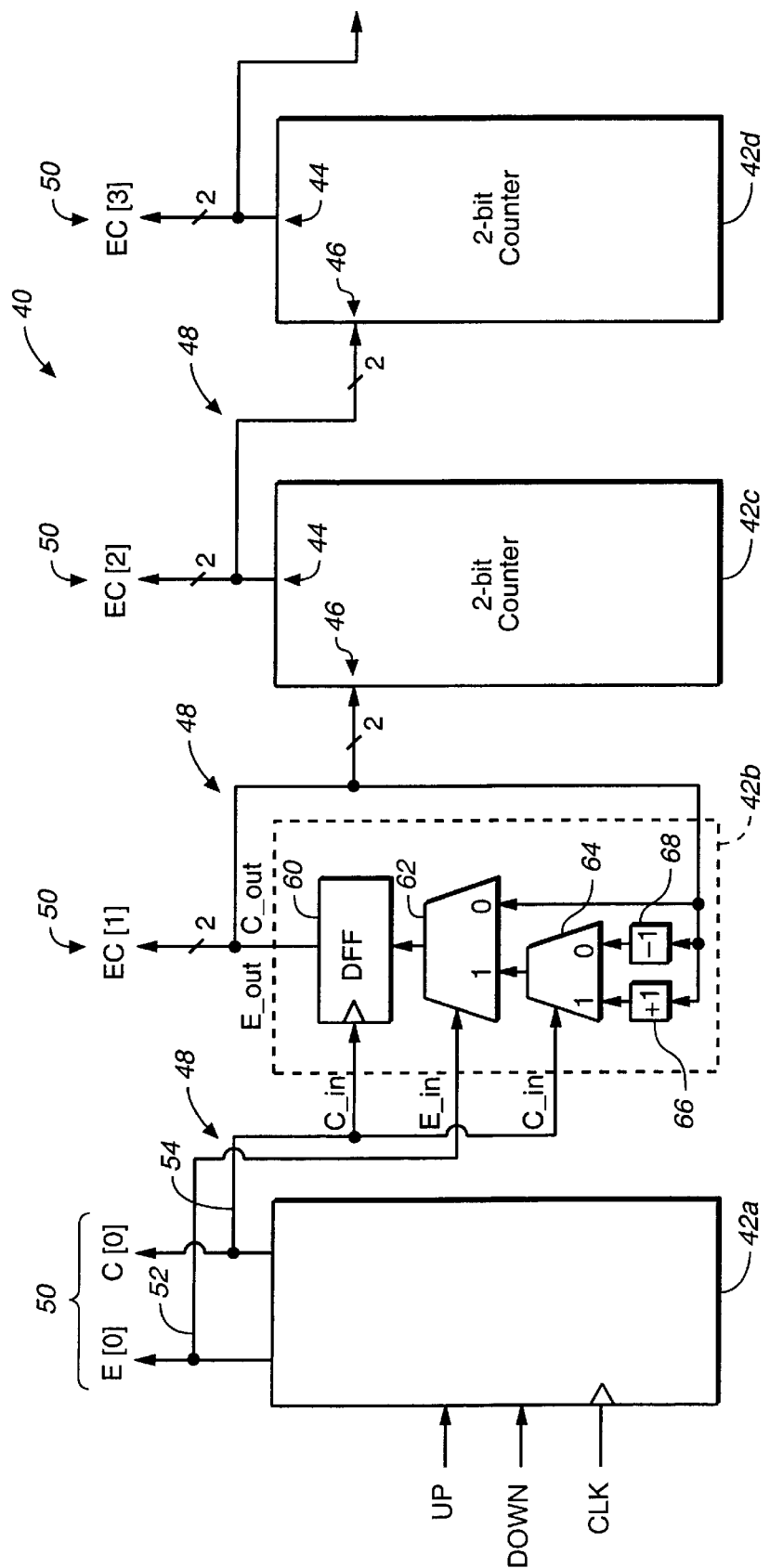
FIG._4

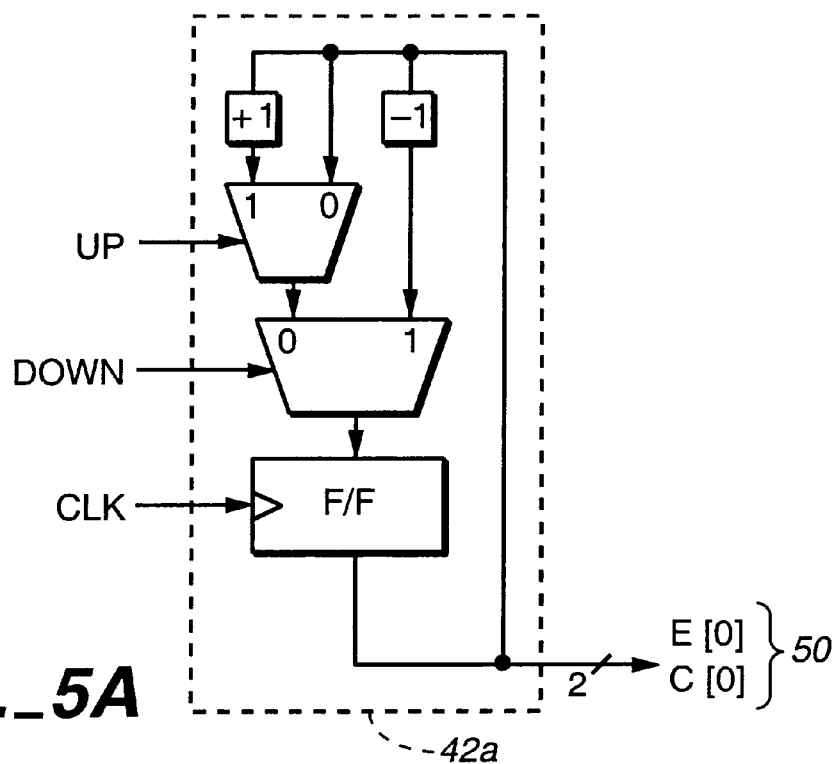
FIG._5A
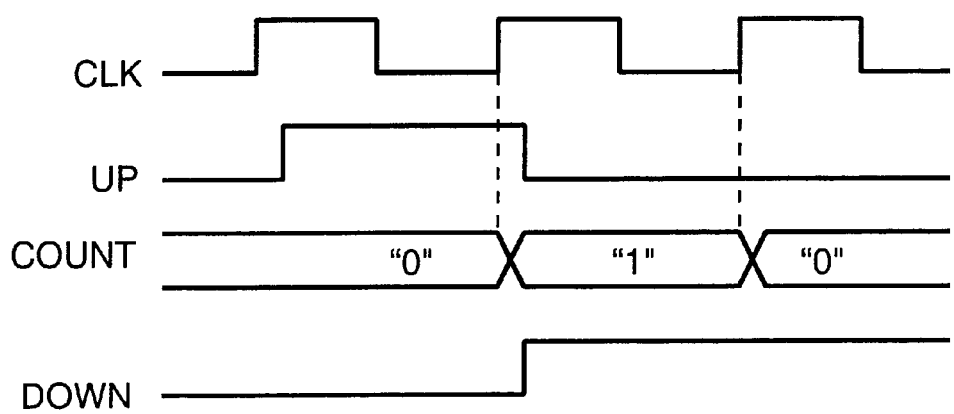
FIG._5B

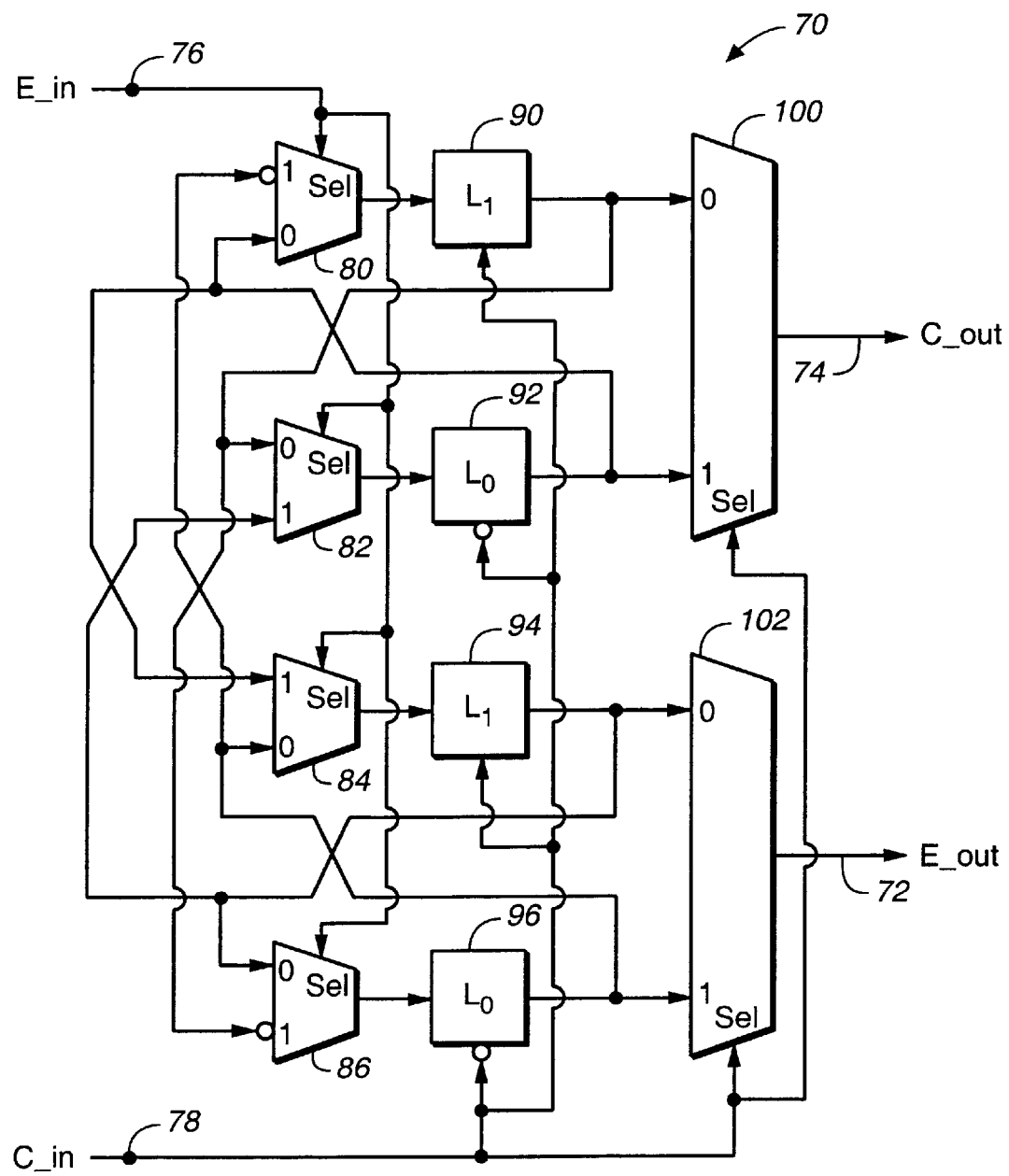
FIG._6

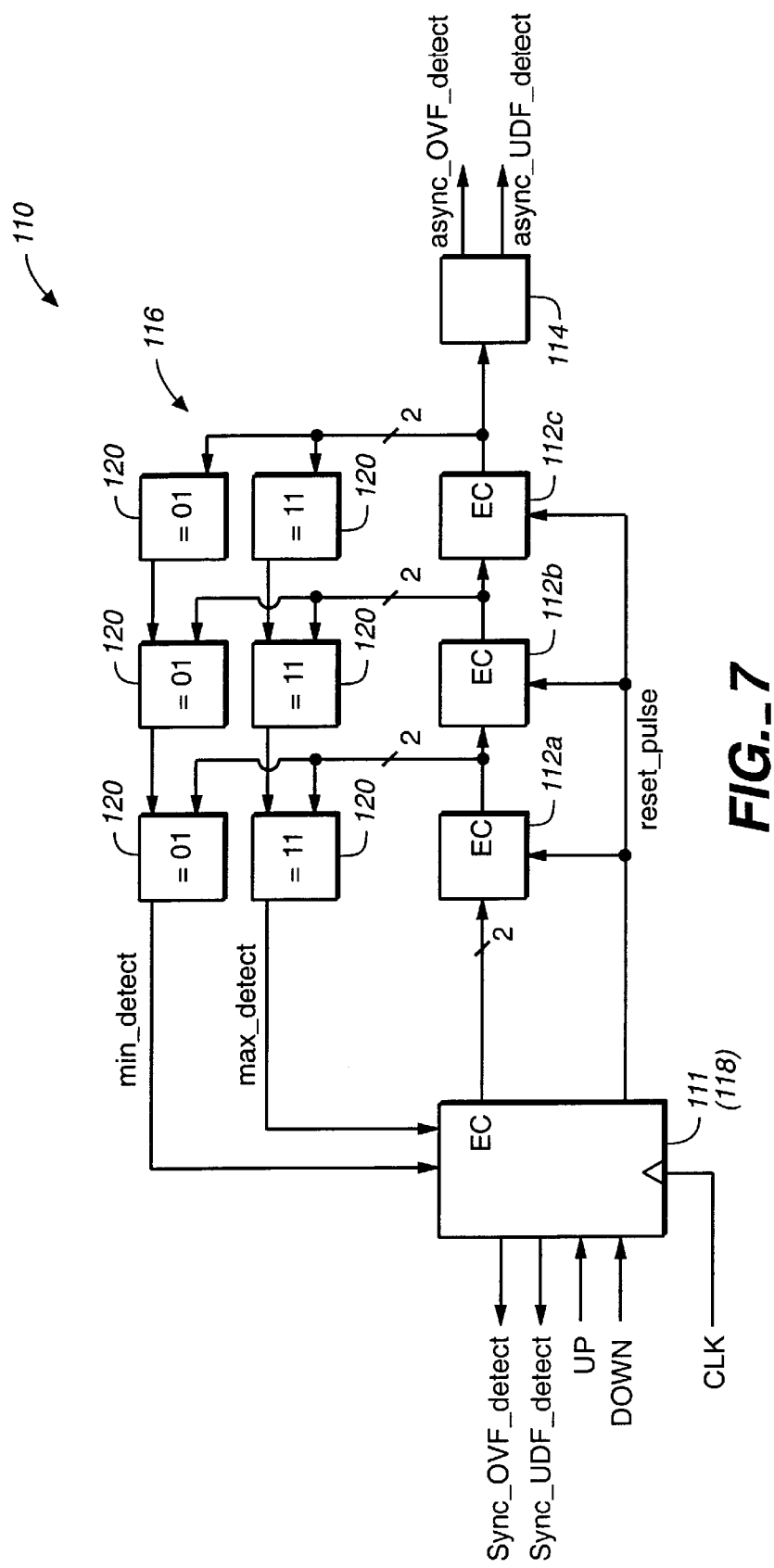
FIG._7

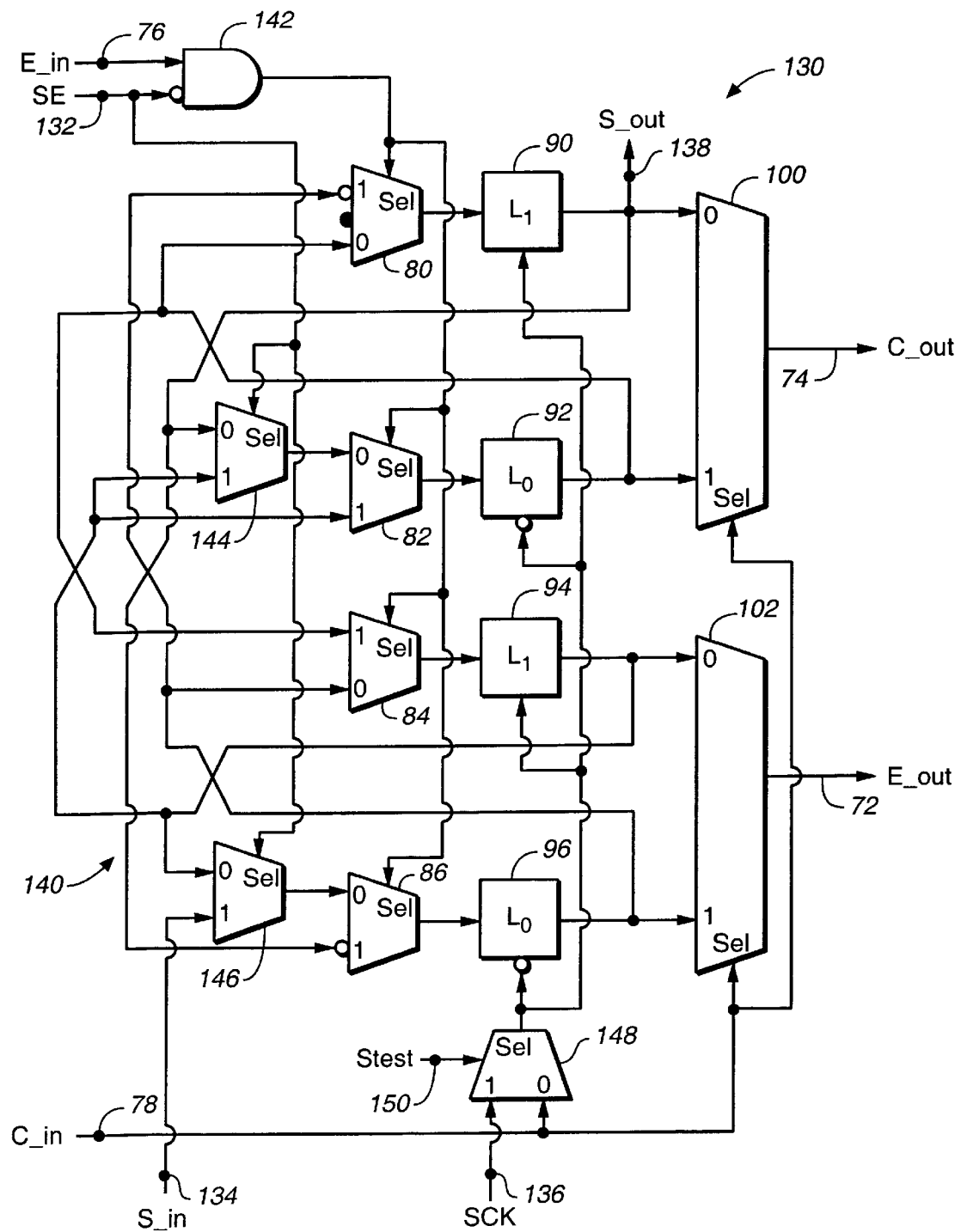
FIG._8

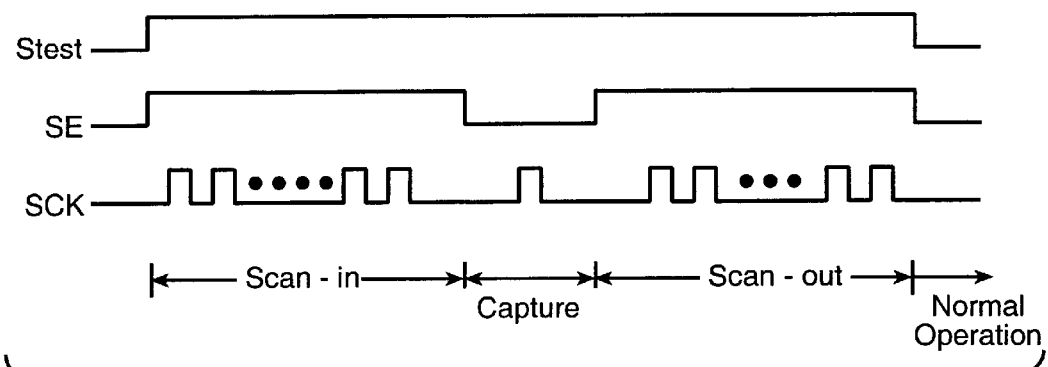
FIG._9
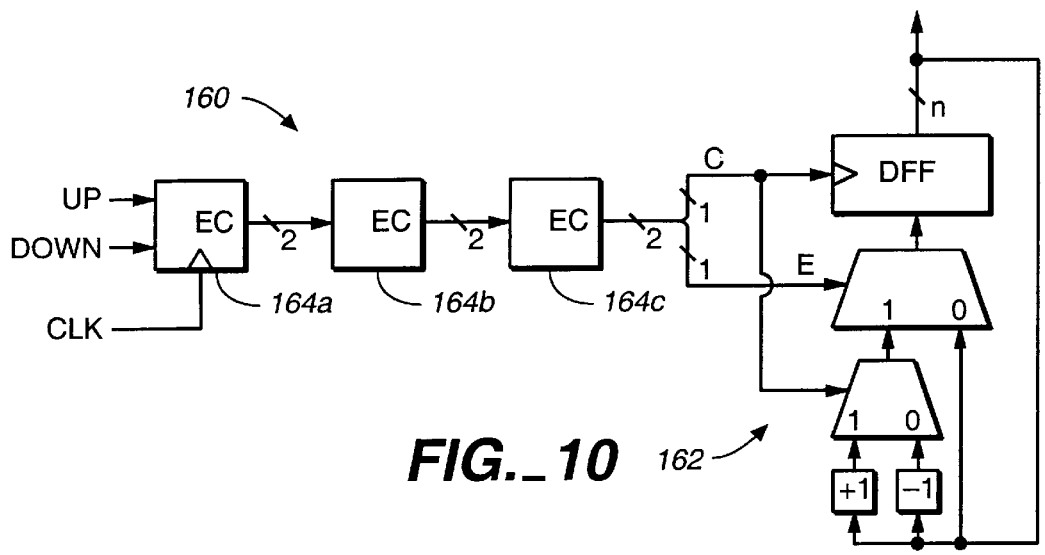
FIG._10
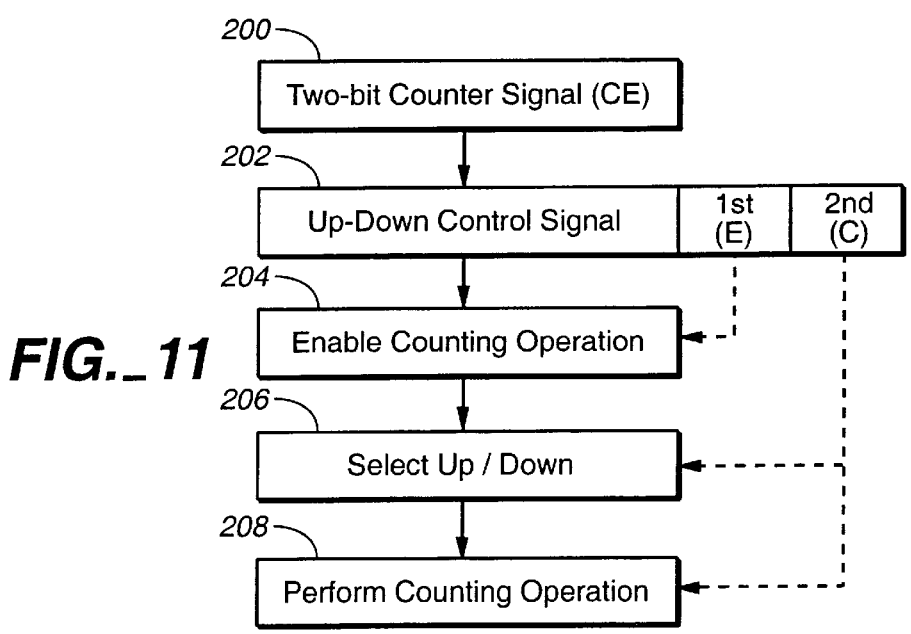
FIG._11

ASYNCHRONOUS UP-DOWN COUNTER AND METHOD FOR OPERATING THE SAME

FIELD OF THE INVENTION

The present invention relates to integrated circuit (IEC) devices. More particularly, the present invention relates to asynchronous counters and a method for operating the same.

BACKGROUND OF THE INVENTION

A high-speed, low power up-down counter is a fundamental component used in many applications, for example, statistics collections circuits, down-sampling circuits, and clock-data-recovery circuits in various communications channels. One conventional approach to achieve a high-speed counter is to partition a synchronous N-bit counter into multiple smaller counters (sub-counter blocks) in a pipeline fashion. Each sub-counter block is supplied with a clock signal which is gated by a control signal. Such a control signal is typically generated using an adjacent less-significant block so as to reduce power consumption. However, this approach requires more complex circuitry because of the gated clock overhead, and also consumes more power than asynchronous approach.

Another widely used conventional approach is to build an asynchronous (or ripple) counter, especially for applications in which latency is not an issue. FIG. 1 schematically illustrates a conventional asynchronous counter 10. As shown in FIG. 1, the Q output of a flip-flop at the n-th bit position is connected to the clock input of a flip-flop at the (n+1)-th bit position. Positive edge-triggered flip-flops are used for a down counter, and negative edge-triggered flip-flops are used for an up counter. Since operation speed is limited only by the toggling rate of the first-stage flip-flop, a very high speed can be achieved. However, the conventional asynchronous counters can only count in one direction.

Therefore, it would be desirable to provide a high-speed, low-power counter which can count in both directions.

BRIEF DESCRIPTION OF THE INVENTION

An asynchronous up-down counter includes a plurality of counter blocks. Each of the counter blocks has a counter output, an up-down control output, and an up-down control input. A counter signal output from each of the counter blocks has at least two bits. The asynchronous up-down counter also includes a signal bus coupling the up-down control output of a first counter block counting lesser significant bits to the up-down control input of a second counter block counting more significant bits. An up-down control signal output from each of the counter blocks has at least two bits. The up-down control signal may include a first control signal enabling counting operation of the second counter block and a second control signal indicating counting-up and counting-down.

BRIEF DESCRIPTION OF THE DRAWINGS

The accompanying drawings, which are incorporated into and constitute a part of this specification, illustrate one or more embodiments of the present invention and, together with the detailed description, serve to explain the principles and implementations of the invention.

In the drawings:

FIG. 1 is a block diagram schematically illustrating a conventional asynchronous counter.

FIG. 2 is a block diagram schematically illustrating an asynchronous up-down counter in accordance with one embodiment of the present invention.

FIG. 3 is a tabular diagram showing the two-bit Grey code and the corresponding decimal and binary values.

FIG. 4 is a block diagram schematically illustrating an asynchronous up-down counter including a plurality of two-bit counter blocks, in accordance with one embodiment of the present invention.

FIG. 5A is an electrical block diagram schematically illustrating an example of the first-stage counter block in accordance with one embodiment of the present invention.

FIG. 5B is a diagram schematically illustrating an example of waveforms of the input and output signals of the first-stage counter block.

FIG. 6 is an electrical block diagram schematically illustrating a counter block circuit for an asynchronous up-down counter in accordance with one embodiment of the present invention.

FIG. 7 is a block diagram schematically illustrating an asynchronous up-down counter including overflow/under flow detection circuitry, in accordance with one embodiment of the present invention.

FIG. 8 is an electrical block diagram schematically illustrating an example of a scannable design for a counter block circuit, in accordance with one embodiment of the present invention.

FIG. 9 is a diagram schematically illustrating waveforms of the signals used in a scan test in accordance with one embodiment of the present invention.

FIG. 10 is a block diagram schematically illustrating an asynchronous up-down counter including an output circuit, in accordance with one embodiment of the present invention.

FIG. 11 is a process flow diagram schematically illustrating a method for operating an asynchronous up-down counter in accordance with one embodiment of the present invention.

DETAILED DESCRIPTION

Embodiments of the present invention are described herein in the context of an asynchronous up-down counter and a method for operating the same. Those of ordinary skill in the art will realize that the following detailed description of the present invention is illustrative only and is not intended to be in any way limiting. Other embodiments of the present invention will readily suggest themselves to such skilled persons having the benefit of this disclosure. Reference will now be made in detail to implementations of the present invention as illustrated in the accompanying drawings. The same reference indicators will be used throughout the drawings and the following detailed description to refer to the same or like parts.

In the interest of clarity, not all of the routine features of the implementations described herein are shown and described. It will, of course, be appreciated that in the development of any such actual implementation, numerous implementation-specific decisions must be made in order to achieve the developer's specific goals, such as compliance with application- and business-related constraints, and that these specific goals will vary from one implementation to another and from one developer to another. Moreover, it will be appreciated that such a development effort might be complex and time-consuming, but would nevertheless be a routine undertaking of engineering for those of ordinary skill in the art having the benefit of this disclosure.

FIG. 2 schematically illustrates an asynchronous up-down counter 20 in accordance with one embodiment of the present invention. As shown in FIG. 2, the asynchronous counter 20 includes a plurality of counter blocks 22 (22a, 22b, 22c, . . . ), and a signal bus 24 provided between the adjacent counter blocks 22. Each of the counter blocks 22 has a counter output 26, an up-down control output 28, and an up-down control input 30. A counter signals ($n_0$, $n_1$, . . . ) output from the counter blocks 22 have at least two bits. The signal bus 24 couples the up-down control output 28 of a counter block 22 counting lesser significant bits to the up-down control input 30 of an adjacent counter block 22 counting more significant bits. An up-down control signal output from each of the counter blocks 22 has at least two bits. As shown in FIG. 2, the first stage (counter block 22a) of the asynchronous counter 20 may be configured as synchronous logic receiving a clock signal (CLK) with a counting-up signal (UP) and a counting-down (DOWN) signal.

In order to distinguish counting-up from counting-down, at least two bits (two binary signals) are used for the up-down control signal to convey the information to the next counter block 22. In general, however, a counter block 22 may have an arbitrary length equal to or greater than 2 bits. In accordance with one embodiment of the present invention, the up-down control signal includes a first control signal for enabling counting operation of the next counter block, and a second control signal for indicating counting-up and counting-down. For example, the first control signal having an active level enables counting operation of the next counter block, and the next counter block performs a counting operation in response to the second control signal. Two types of transition edges (rising and falling) of the second control signal may be used to differentiate counting up operation and counting down operation.

In accordance with one embodiment of the present invention, the up-down control signal is a two-bit Grey-code signal. For example, the two-bit Grey-code includes a set of codewords: 01, 00, 10, and 11 representing counts 0, 1, 2, and 3 (or binary values 00, 01, 10, and 11), respectively. The first and second control signals of the up-down control signal may represent the least significant bit (LSB) and the most significant bit (MSB) of the Grey-code, respectively. FIG. 3 shows the two-bit Grey code ("CE"). The first control signal (enable signal) represents the "E" bit, and the second control signal (counting signal) represents the "C" bit of the code.

FIG. 4 schematically illustrates an asynchronous up-down counter 40 in accordance with one embodiment of the present invention, in which a plurality of counter blocks 42 (42a, 42b, 42c, . . . ) are two-bit counter blocks. As shown in FIG. 4, each of the two-bit counter blocks has a counter output 44 and an up-down control input 46. A control signal bus 48 couples the counter output 44 of a first counter block counting lesser significant bits (for example, counter block 42c) to the up-down control input 46 of a second counter block counting more significant bits (for example, the counter block 42d). That is, the counter signal of each counter block 42 is supplied as the up-down control signal to the next counter block 42.

In this embodiment, the two-bit counter signal 50 of each counter block 42 is also a two-bit Grey-code signal. Thus, as shown in FIG. 4, the LSB of the counter signal 50 ("E" bit) is supplied to the next counter block 42 as the first control signal 52, and the MSB of the counter signal 50 ("C" bit) is supplied to the next counter block 42 as the second control signal 54. Since the codewords ("CE") 01, 00, 10, and 11 represent counts 0, 1, 2, and 3, (or binary values 00, 01, 10, and 11) respectively, whenever the counter output (representing "CE") changes from 11 to 01 (i.e., count "3" to "0"), overflow of the counter block 42 occurs and the count of the next counter block 42 is incremented by 1. Similarly, when the counter output "CE" changes from 01 to 11, under flow occurs and the count of the next counter block is decremented by 1.

The logic implementation of the 2-bit counter block is shown in the counter block 42b in FIG. 4. The counter block 42 includes two double-edge triggered flip-flops 60, an enable circuit 62, a selector 64, and count up/down combinatorial logic 66 and 68. The output of the flip-lops 60 denotes the two-bit counter output 50 (C__out and E__out). The first control signal 52 (E__in) input from the lesser-significant-bit block (counter block 42a) enables the flip-flops 60 via the enable circuit 62 (typically a selector or multiplexer). The first control signal 52 (E-in) having bit "1" (active level) enables counting operation of the next counter block, since when "E-in" has a bit "1", a change in the second control signal 54 (C-in) requires either count-up (overflow of the previous block) or count down (under flow of the previous block), as described above.

The second control signal 54 (C__in) input from the lesser-significant-bit block (counter block 42a) triggers the flip-flops 60 to operate, and the state of the second control signal 54 (C__in) before switching (toggling) controls the selector 64 to select either the count-up combinational logic 66 or the count-down combinational logic 68. The second control signal 54 (C__in) that goes from bit "1" to bit "0" (high-to-low transition or falling edge) selects count-up combinational logic, and the second control signal 54 (C__in) that goes from bit "0" to bit "1" (low-to-high transition or raising edge) selects count-down combinational logic. This basic 2-bit cell (counter block) can be concatenated by connecting the two-bit counter output 50 (E__out and C__out) to the control input (E__in and C__in) of the adjacent more-significant-bit cell to form a larger counter. It should be noted that, in FIG. 4, the two-bit counter output 50 is labeled as "EC" because, in the FIG. 4, the LSB and LSB block are placed in the left of the MSB and MSB block, respectively.

The first stage (the two-bit counter block 42a) of the asynchronous counter 40 may be configured as synchronous logic receiving a clock signal (CLK) with a count-up signal (UP) and a count-down signal (DOWN). FIG. 5A schematically illustrates an example of the first-stage counter block 42a. FIG. 5B schematically illustrates an example of waveforms of these signals and the output of the counter block (count value). As shown in FIG. 5B, a rising edge of the clock signal (CLK) triggers a count-up operation when the count-up signal (UP) is active (at high level), and triggers a count-down operation when the count-down signal (DOWN) is active (at high level).

FIG. 6 schematically illustrates a counter block circuit 70 for an asynchronous up-down counter in accordance with one embodiment of the present invention. The counter block circuit 70 can be used as a counter cell or module to form a larger asynchronous up-down counter such as the asynchronous up-down counter 40 shown in FIG. 4. As shown in FIG. 6, the counter block 70 circuit includes a counter output port having a first output node 72 for outputting a first counter output signal (E__out), and a second output node 74 for outputting a second counter output signal (C__out), and an up-down control port having a first input node 76 for receiving a first control signal (E__in) and a second input node 78 for receiving a second control signal (C__in). This example of logic implementation of the counter block circuit design optimizes C_in to C_out propagation delay.

The counter block circuit 70 also includes a first multiplexer 80, a second multiplexer 82, a third multiplexer 84, and fourth multiplexer 86, which select inputs (Sel) are all coupled to the first input node 76. The counter block circuit 70 further includes a first latch circuit 90, a second latch circuit 92, a third latch circuit 94, a fourth latch circuit 96, a fifth multiplexer 100, and a sixth multiplexer 102. The first latch circuit 90 has a data input coupled to an output of the first multiplexer 80 and an enable input coupled to the second input node 78. An output of the first latch circuit 90 is coupled to a first data input (0) of the second multiplexer 82 and to a second data input (1) of the fourth multiplexer 86 via an inverter. The second latch circuit 92 has a data input coupled to an output of the second multiplexer 82, and an enable input coupled to the second input node 78 via an inverter. An output of the second latch circuit 92 is coupled to a first data input (0) of the first multiplexer 80 and to a second data input (1) of the third multiplexer 84. The third latch circuit 94 has a data input coupled to an output of the third multiplexer 84, and an enable input coupled to the second input node 78. An output of the third latch circuit 94 is coupled to a second data input (1) of the second multiplexer 82 and to a first data input (0) of the fourth multiplexer 86. The fourth latch circuit 96 has a data input coupled to an output of the fourth multiplexer 86, and an enable input coupled to the second input node 78 via an inverter. An output of the fourth latch circuit 96 is coupled to a second data input (1) of the first multiplexer 80 via an inverter and to a first data input (0) of the third multiplexer 84. The first and third latch circuits 90 and 94 are positive-level sensitive transparent latch circuits, and the second and fourth latch circuits 92 and 96 are negative-level sensitive transparent latch circuits.

The fifth multiplexer 100 has an output coupled to the second output node 74, a first data input (0) coupled to the output of the first latch circuit 90, a second data input (1) coupled to the output of the second latch circuit 92, and a select input (Sel) coupled to the second input node 78. The sixth multiplexer 102 has an output coupled to the first output node 72, a first data input (0) coupled to the output of the third latch circuit 94, a second data input (1) coupled to the output of the fourth latch circuit 96, and a select input (Sel) coupled to the first input node 72.

The first and second counter output signals (E_out and C_out) of the counter block circuit 70 may be supplied to a next counter block circuit as the first and second control signals (E_in and C-in), respectively. Similar to the previous embodiments, the first and second control signals (E_in and C_in) may constitute a two-bit Grey-code signal.

In accordance with one embodiment of the present invention, the asynchronous up-down counter includes a reset feature. Referring back to FIG. 4, the double-edge triggered flip-flops 60 may be reset/preset to initialize the counter to an arbitrary value via their reset or set inputs (not shown). Similarly, in the counter block circuit 70 shown in FIG. 6, the transparent latches 90–96 are initialized to the proper states depending on the desired counter value after an asynchronous reset. For example, the latch circuits 90–96 are reset to have initial values 0, 0, 1, 1, respectively, to obtain the initial Grey-code value of CE=01 (binary value: "00" or count "0"). Such a reset or preset operation can be performed using a reset input (not shown) of each of the latch circuits 90–96.

Some form of overflow/under flow detection is often needed in a counter circuit design. FIG. 7 schematically illustrates an asynchronous up-down counter 110 in accordance with one embodiment of the present invention, which includes overflow/under flow detection circuitry. As shown in FIG. 7, the asynchronous counter circuit 110 includes a plurality of counter blocks 112 (112a, 112b, 112c) which may be used for the counter blocks 22, 42, or 70 as described above. The first-stage counter block (control logic) 111 may be a synchronous counter block receiving a clock signal (CLK) with count-up/down signals (UP and DOWN), as shown in FIG. 7. The counter signal outputs (not shown) of the counter blocks 112 may be the same as the corresponding control signals if the counter blocks 112 are two-bit Grey-code counters, as described above. It should be noted that the number of the counter blocks 112 are not limited to this number as shown in FIG. 7, but may be any number depending on the counter size.

If a reset upon overflow/under flow detection is not required, overflow/under flow information can be obtained by examining the counter signal (E_out and C_out) output from the MSB block (counter block 112c in FIG. 7). In this case, the synchronous counter circuit 110 further includes and a detection circuit 114 coupled to the up-down control output of the MSB counter block 112c. Since the up-down control signal from the MSB counter block indicates overflow or under flow of the up-down counter circuit 110, the detection circuit outputs overflow and under flow detection signals (async_OVF_detect, async_UDF_detect) in response to the control signal directing count-up and count-down operation, respectively.

If synchronous reset is needed upon overflow or under flow, the asynchronous up-down circuit 110 includes (in addition to, or in place of the detection circuit 114) a detection circuit 116 coupled to the respective up-down control output of the counter blocks 112. The asynchronous up-down counter 110 also includes a reset circuit 118 coupled to the detection circuit 116. The reset circuit 118 may be implemented within the counter control logic (the first-stage counter block 111), as shown in FIG. 7. The reset circuit 118 provides a rest signal to the counter blocks 112.

The detection circuit 116 includes "matched" logic cells 120, each of which detects either the maximum value when the Grey-code value CE equals to 11 (count "3"), or the minimum value when the Grey code value CE equals to 01 (count "0"). The logic cells 120 are connected in a daisy-chain to provide the overflow/under flow signal to the first-stage counter block 111 as shown in FIG. 7. The overflow/under flow signals (sync_OVF_detect, sync_UDF_detect) can be synchronized with the input clock (CLK) of the first-stage counter block 111 to generate a synchronous reset signal to re-initialize the entire up-down counter 110. It should be noted that the inputs to the up-stream portions of the daisy-chain (logic cells 120 other than one for the LSB counter block) are already settled before an overflow/under flow occurs and therefore the chained logic cells 120 does not affect the counter speed.

In order to improve testability, the up-down counter circuit may be made scannable. FIG. 8 schematically illustrates a counter block circuit 130 in accordance with one embodiment of the present invention. The counter block circuit 130 includes scan circuitry in addition to the counter block circuit 70 described above (FIG. 6). The like components are labeled with the like numerals as the counter block circuits 70. As shown in FIG. 8, the counter block circuit 130 further includes a scan signal input port having a scan enable signal (SE) input node 132, a scan signal input (S_in) node 134, a clock signal (SCK) input node 136, and a scan test enable (Stest) input node 150. The counter block circuit 130 also includes a scan signal output (S_out) node 138 coupled the output of the first latch circuit 90. A scan circuit 140 is coupled to the scan signal input port (nodes 132, 134, 136, and 150) and to the scan up-down control input port (the first and second input nodes 76 and 78).

As shown in FIG. 8, the scan circuit 140 includes an AND circuit 142, a first selector 144, a second selector 146, and a third selector 148. The AND circuit 142 includes an input coupled to the first input node 76, an inverted input coupled to the scan enable signal input node 132, and an output coupled to the select inputs of the first, second, third, and fourth multiplexers 80, 82, 84, and 86. The first selector 144 includes a select input coupled to the scan enable signal input node 132, a first input (0) coupled to the output of the first latch circuit 90, a second input (1) coupled to the output of the third latch circuit 94, and an output coupled to the first input (0) of the second multiplexer 82. The second selector 146 includes a select input coupled to the scan enable signal input node 132, a first input (0) coupled to the output of the third latch circuit 94, a second input (1) coupled to the scan signal input node 134, and an output coupled to the first input (0) of the fourth multiplexer 96. The third selector 148 includes a select input coupled to the scan test enable input node 150, a first input (0) coupled to the first input node 78, a second input (1) coupled to the clock signal input node 136, and an output coupled to the enable inputs of the first and third latch circuits 90 and 94 and coupled via respective inverters to the enable inputs of the second and fourth latch circuits 92 and 96.

FIG. 9 schematically illustrates waveforms of the signals (scan test enable signal Stest, scan enable signal SE, and scan clock signal SCK) used in a scan test. As shown in FIG. 8, the scan test enable signal Stest controls the third selector 148 so that the latch circuits 90–96 are clocked by the scan clock signal SCK. The scan enable signal SE denotes the scan-in and scan-out operations as shown in FIG. 9. During the scan-in operation, the scan data is input from the scan signal input node 134 to the latch circuits 90–96 through the scan path defined by the selectors/multiplexers (according to the scan enable signal SE) so that each latch circuit is set to a predetermined value. The latch circuits 90–96 capture the value with a single clock pulse, as shown in FIG. 9, and then the captured values are scanned-out from the scan signal output node 138 through the scan-out operation.

In some applications, it may be desirable to have a group of counter bits toggle at the same time, or to have binary values to drive another digital circuit. For example, a non-Grey-code output may be used to directly drive a digital-to-analog converter (DAC). FIG. 10 schematically illustrates an asynchronous up-down counter 160 in accordance with one embodiment of the present invention, which includes an output circuit 162. The output circuit 162 converts a Grey-code output from the upper MSB counter block 164c into a binary value. The operation of the output circuit 162 would be well understood by those of ordinary skill in the art from the diagram.

FIG. 11 schematically illustrates a method for operating an asynchronous up-down counter in accordance with one embodiment of the present invention. The asynchronous up-down counter includes a plurality of two-bit counter blocks, for example, such as the asynchronous up-down counter 40 shown in FIG. 4. The method includes outputting a two-bit counter signal from a first counter block (200), and providing the two-bit counter signal to a second counter block as an up-down control signal (202). The two-bit counter signal may be a two-bit Grey-code signal having a code value CE, where E represents the LSB, and C represents the MSB, as described above. The up-down control signal includes a first control signal representing the LSB ("E") and a second control signal representing the MSB ("C").

The counting operation of the second counter block is enabled in accordance with the first control signal (204), and either count-up or count-down operation is selected in accordance with a transition in the second control signal (206). For example, an active level (logic high or bit "1") of the first control signal may enable the counter operation. A falling edge and rising edge of the second control signal may specify count-up and count-down operation, respectively. The second counter block performs the selected counting operation in response to the second control signal (208).

As described above, in accordance with embodiments of the present invention, the asynchronous up-down counters have a very simple and modular design which can be easily extended to larger counter design. The simple logic and asynchronous design minimizes switching activities of the up-down counter, realizing very low power consumption. In addition, the maximum delay between output transitions is given by one multiplexer delay plus one transparent latch delay, realizing high-speed counter operation. Furthermore, a scannable design is provided with small overhead.

While embodiments and applications of this invention have been shown and described, it would be apparent to those skilled in the art having the benefit of this disclosure that many more modifications than mentioned above are possible without departing from the inventive concepts herein. The invention, therefore, is not to be restricted except in the spirit of the appended claims.

What is claimed is:

1. An asynchronous up-down counter comprising:
   a plurality of counter blocks, each of said counter blocks having a counter output, an up-down control output, and an up-down control input, a counter signal output from each of said counter blocks having at least two bits; and
   a signal bus coupling the up-down control output of a first counter block counting lesser significant bits to the up-down control input of a second counter block counting more significant bits, an up-down control signal output from each of said counter blocks having at least two bits.

2. An asynchronous up-down counter in accordance with claim 1 wherein the up-down control signal includes:
   a first control signal enabling counting operation of the second counter block; and
   a second control signal indicating counting-up and counting-down.

3. An asynchronous up-down counter in accordance with claim 1 wherein the up-down control signal is a two-bit Grey-code signal.

4. An asynchronous up-down counter in accordance with claim 3 wherein the two-bit Grey-code includes a set of codewords: 01, 00, 10, and 11 representing counts 0, 1, 2, and 3, respectively.

5. An asynchronous up-down counter in accordance with claim 3 wherein the up-down control signal includes a first control signal representing a least significant bit of the Grey-code and a second control signal representing a most significant bit of the Grey-code.

6. An asynchronous up-down counter in accordance with claim 5 wherein the first control signal having an active level enables counting operation of the second counter block.

7. An asynchronous up-down counter in accordance with claim 6 wherein the active level is logical high (bit 1).

8. An asynchronous up-down counter in accordance with claim 5 wherein the second counter block performs a counting operation in response to the second control signal.

9. An asynchronous up-down counter in accordance with claim 8 wherein the second counter block counts-up in response to the second control signal having an transition edge of a first type.

10. An asynchronous up-down counter in accordance with claim 9 wherein the first type transition edge is a low-to-high (bit 0 to bit 1) transition edge.

11. An asynchronous up-down counter in accordance with claim 8 wherein the second counter block counts-down in response to the second control signal having a transition edge of a second type.

12. An asynchronous up-down counter in accordance with claim 11 wherein the second type transition edge is a high-to-low (bit 1 to 0) transition edge.

13. An asynchronous up-down counter in accordance with claim 1 wherein each of said counter blocks is a two-bit counter.

14. An asynchronous up-down counter in accordance with claim 1 wherein the counter signal output from each counter block is a two-bit Grey-code signal.

15. An asynchronous up-down counter in accordance with claim 14 wherein the counter signal of the first counter block is supplied to the second counter block as the up-down control signal.

16. An asynchronous up-down counter in accordance with claim 1, further comprising:
   a detection circuit coupled to the up-down control output of the counter block counting a most-significant-bit, said detection circuit detecting an overflow or under flow of said asynchronous up-down counter.

17. An asynchronous up-down counter in accordance with claim 1 wherein each of said counter blocks further includes a reset input, said asynchronous up-down counter further comprising:
   a detection circuit coupled to the up-down control output of each of said counter blocks; and
   a reset circuit coupled to said detection circuit, said reset circuit provides a reset signal to each of said counter blocks.

18. An asynchronous up-down counter comprising:
   a plurality of two-bit counter blocks, each of said counter blocks having a counter output and an up-down control input; and
   a control signal bus coupling the counter output of a first counter block counting lesser significant bits to the up-down control input of a second counter block counting more significant bits.

19. An asynchronous up-down counter in accordance with claim 18 wherein a counter signal output from each of said counter blocks is a two-bit Grey-code signal.

20. An asynchronous up-down counter in accordance with claim 19 wherein the two-bit Grey-code includes a set of codewords: 01, 00, 10, and 11 representing counts 0, 1, 2, and 3, respectively.

21. An asynchronous up-down counter in accordance with claim 19 wherein the second counter block receives the counter signal as an up-down control signal, the up-down control signal including a first control signal representing a least significant bit of the Grey-code and a second control signal representing a most significant bit of the Grey-code.

22. An asynchronous up-down counter in accordance with claim 21 wherein the first control signal having an active level enables counting operation of the second counter block.

23. An asynchronous up-down counter in accordance with claim 22 wherein the active level is logical high (bit 1).

24. An asynchronous up-down counter in accordance with claim 21 wherein the second counter block performs a counting operation in response to the second control signal.

25. An asynchronous up-down counter in accordance with claim 24 wherein the second counter block counts-up in response to the second control signal having an transition edge of a first type.

26. An asynchronous up-down counter in accordance with claim 25 wherein the first type transition edge is a low-to-high (bit 0 to bit 1) transition edge.

27. An asynchronous up-down counter in accordance with claim 24 wherein the second counter block counts-down in response to the second control signal having a transition edge of a second type.

28. An asynchronous up-down counter in accordance with claim 27 wherein the second type transition edge is a high-to-low (bit 1 to 0) transition edge.

29. A counter block circuit for an asynchronous up-down counter including a plurality of counter blocks, said counter block circuit comprising:
   a counter output port including
      a first output node for outputting a first counter output signal, and
      a second output node for outputting a second counter output signal;
   an up-down control port including
      a first input node for receiving a first control signal, and
      a second input node for receiving a second control signal;
   a first multiplexer having a select input coupled to said first input node;
   a second multiplexer having a select input coupled to said first input node;
   a third multiplexer having a select input coupled to said first input node;
   a fourth multiplexer having a select input coupled to said first input node;
   a first latch circuit having a data input coupled to an output of said first multiplexer, an enable input coupled to said second input node, and an output coupled to a first data input of said second multiplexer and coupled via an inverter to a second data input of said fourth multiplexer;
   a second latch circuit having a data input coupled to an output of said second multiplexer, an enable input coupled to said second input node via an inverter, and an output coupled to a first data input of said first multiplexer and to a second data input of said third multiplexer;
   a third latch circuit having a data input coupled to an output of said third multiplexer, an enable input coupled to said second input node, and an output coupled to a second data input of said second multiplexer and to a first data input of said fourth multiplexer;
   a fourth latch circuit having a data input coupled to an output of said fourth multiplexer, an enable input coupled to said second input node via an inverter, and an output coupled to a second data input of said first multiplexer via an inverter and to a first data input of said third multiplexer;
   a fifth multiplexer having an output coupled to said second output node, a first data input coupled to the output of said first latch circuit, a second data input coupled to the output of said second latch circuit, and a select input coupled to said second input node; and a sixth multiplexer having an output coupled to said first output node, a first data input coupled to the output of said third latch circuit, a second data input coupled to the output of said fourth latch circuit, and a select input coupled to said second input node.

30. A counter block circuit in accordance with claim 29 wherein the first and secondcounter output signals are supplied to a next counter block circuit as the first and second control signals, respectively.

31. A counter block circuit in accordance with claim 29 wherein said first and second control signals constitute a two-bit Grey-code signal.

32. A counter block circuit in accordance with claim 31 wherein the two-bit Grey-code includes a set of codewords: 01, 00, 10, and 11 representing counts 0, 1, 2, and 3, respectively.

33. A counter block circuit in accordance with claim 32 wherein said first, second, third, and fourth latch circuits are reset to have initial values 0, 0, 1, 1, respectively.

34. A counter block circuit in accordance with claim 29 wherein said first and third latch circuits are positive-level sensitive transparent latch circuits, and said second and fourth latch circuits are negative-level sensitive transparent latch circuits.

35. A counter block circuit in accordance with claim 29, further comprising:

a scan signal input port including
a scan enable signal input node,
a scan signal input node, and
a clock signal input node;

a scan signal output node coupled the output of said first latch circuit; and a scan circuit coupled to said scan signal input port and said scan up-down control input port.

36. A counter block circuit in accordance with claim 35 wherein said scan signal input port further includes a scan test enable input node, and wherein said scan circuit includes:

an AND circuit having an input coupled to said first input node, an inverted input coupled to said scan enable signal input node, and an output coupled to the select inputs of said first, second, third, and fourth multiplexers;

a first selector having a select input coupled to said scan enable signal input node, a first input coupled to the output of said first latch circuit, a second input coupled to the output of said third latch circuit, and an output coupled to the first input of said second multiplexer;

a second selector having a select input coupled to said scan enable signal input node, a first input coupled to the output of said third latch circuit, a second input coupled to said scan signal input node, and an output coupled to the first input of said fourth multiplexer; and a third selector having a select input coupled to the scan test enable input node, a first input coupled to said first input node, a second input coupled to the clock signal input node, and an output coupled to the enable inputs of said first and third latch circuits and coupled via respective inverters to the enable inputs of said second and fourth latch circuits.

37. A method for operating an asynchronous up-down counter, the asynchronous up-down counter including a plurality of counter blocks, said method comprising:

outputting a two-bit counter signal from a first counter block;

providing the two-bit counter signal to a second counter block as an up-down control signal, the up-down control signal including a first control signal representing a least significant bit and a second control signal representing a most significant bit;

enabling counting operation of the second counter block in accordance with the first control signal;

selecting counting operation in accordance with a transition in the second control signal; and performing the selected counting operation in response to the second control signal.

38. A method in accordance with claim 37 wherein the two-bit counter signal is a two-bit Grey-code signal.

39. A method in accordance with claim 37 wherein the counting operation is enabled if the first control signal has an active level.

40. A method in accordance with claim 39 wherein the active level is logical high (bit 1).

41. A method in accordance with claim 37 wherein said selecting includes:

selecting counting-up operation if the second control signal has an transition edge of a first type; and selecting counting-down operation if the second control signal has an transition edge of a second type.

42. A method in accordance with claim 41 wherein the first type transition edge is a low-to-high (bit 0 to bit 1) transition edge, and the second type transition edge is a high-to-low (bit 1 to 0) transition edge.

43. A counter block circuit for an asynchronous up-down counter, the asynchronous up-down counter including a plurality of counter blocks, said counter block circuit comprising:

means for outputting a two-bit counter signal from a first counter block;

means for providing the two-bit counter signal to a second counter block as an up-down control signal, the up-down control signal including a first control signal representing a least significant bit and a second control signal representing a most significant bit;

means for enabling counting operation of the second counter block in accordance with the first control signal;

means for selecting counting operation in accordance with a transition in the second control signal; and means for performing the selected counting operation in response to the second control signal.

* * * * *